(12) United States Patent
You

(10) Patent No.: US 9,728,746 B2
(45) Date of Patent: Aug. 8, 2017

(54) ENCAPSULATION STRUCTURES, ENCAPSULATION METHODS, AND DISPLAY DEVICES OF ORGANIC ELECTROLUMINESCENT DEVICES

(71) Applicant: BOE TECHNOLOGY GROUP CO., LTD., Beijing (CN)

(72) Inventor: Juanjuan You, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/424,170

(22) PCT Filed: Jun. 27, 2014

(86) PCT No.: PCT/CN2014/080902
§ 371 (c)(1),
(2) Date: Feb. 26, 2015

(87) PCT Pub. No.: WO2015/043263
PCT Pub. Date: Apr. 2, 2015

(65) Prior Publication Data
US 2015/0380683 A1    Dec. 31, 2015

(30) Foreign Application Priority Data

Sep. 29, 2013  (CN) .......................... 2013 1 0454581

(51) Int. Cl.
*H01L 51/52* (2006.01)
*H01L 51/56* (2006.01)
*H01L 51/00* (2006.01)

(52) U.S. Cl.
CPC ...... *H01L 51/5256* (2013.01); *H01L 51/5253* (2013.01); *H01L 51/56* (2013.01); *H01L 51/0035* (2013.01); *H01L 2251/558* (2013.01)

(58) Field of Classification Search
CPC . H01L 51/5237; H01L 51/5253; H01L 33/52; H01L 51/5256
See application file for complete search history.

(56) References Cited

U.S. PATENT DOCUMENTS 5,942,446 A * 8/1999 Chen ................. H01L 21/31116
216/67
6,537,688 B2   3/2003 Silvernail et al.
(Continued)

FOREIGN PATENT DOCUMENTS

CN    101045610 A    10/2007
CN    101097942 A    1/2008
(Continued)

OTHER PUBLICATIONS

English Translation of the International Search Report of PCT/CN2014/080902 published in English on Apr. 2, 2015.
(Continued)

*Primary Examiner* — John C Ingham
(74) *Attorney, Agent, or Firm* — Collard & Roe, P.C.

(57) ABSTRACT

Disclosed are encapsulation structures, encapsulation methods and display devices of organic electroluminescent devices. The encapsulation structure comprises: a substrate (3); an organic electroluminescent device (2) located on the substrate (3); and at least one film encapsulation layer (1) covering the organic electroluminescent device (2), wherein the film encapsulation layer (1) comprises an inorganic film (11) and a fluorocarbon polymer film (13). The encapsulation structure can effectively improve the film encapsulation layer (1)'s ability to block water and oxygen so as to effectively extend the lifetime of OLED devices.

11 Claims, 1 Drawing Sheet

(56) References Cited

U.S. PATENT DOCUMENTS

| | | | |
|---|---|---|---|
| 6,624,568 | B2 | 9/2003 | Silvernail |
| 6,864,629 | B2 * | 3/2005 | Miyaguchi ......... H01L 51/5253 313/512 |
| 6,914,007 | B2 * | 7/2005 | Ma .................... H01J 37/32009 257/E21.252 |
| 6,972,480 | B2 * | 12/2005 | Zilber ................ H01L 23/3114 257/676 |
| 7,018,713 | B2 * | 3/2006 | Padiyath ................ B32B 27/08 428/411.1 |
| 7,518,142 | B2 | 4/2009 | Hoffmann et al. |
| 8,232,350 | B2 * | 7/2012 | Fujita ..................... C08L 23/22 525/191 |
| 8,455,113 | B2 | 6/2013 | Yamada et al. |
| 8,633,574 | B2 * | 1/2014 | Schaepkens ........ H01L 51/0097 257/40 |
| 8,736,163 | B2 | 5/2014 | Kim et al. |
| 8,900,366 | B2 * | 12/2014 | Rosenblum ................... 118/719 |
| 2012/0227809 | A1 * | 9/2012 | Bharti ................... C09J 7/0296 136/259 |

FOREIGN PATENT DOCUMENTS

| | | |
|---|---|---|
| CN | 101106178 A | 1/2008 |
| CN | 101752513 A | 6/2010 |
| CN | 102610762 A | 7/2012 |
| CN | 103490019 A | 1/2014 |
| CN | 203466226 U | 3/2014 |

OTHER PUBLICATIONS

International Search Report and Written Opinion of the International Searching Authority with Notice of Transmittal of the International Search Report and Written Opinion of PCT/CN2014/080902 in Chinese, mailed Sep. 24, 2014.

Chinese Office Action of Chinese Application No. 201310454581.1, mailed May 20, 2015 with English translation.

English translation of the International Preliminary Report on Patentability and Written Opinion of the International Searching Authority of PCT/CN2014/080902, issued Mar. 29, 2016.

* cited by examiner ns of the application is the National Stage of PCT/CN2014/080902 filed on Jun. 27, 2014..."

ENCAPSULATION STRUCTURES, ENCAPSULATION METHODS, AND DISPLAY DEVICES OF ORGANIC ELECTROLUMINESCENT DEVICES

CROSS REFERENCE TO RELATED APPLICATIONS

This application is the National Stage of PCT/CN2014/080902 filed on Jun. 27, 2014, which claims priority under 35 U.S.C. §119 of Chinese Application No. 201310454581.1 filed on Sep. 29, 2013, the disclosure of which is incorporated by reference.

TECHNICAL FIELD

At least one embodiment of the present invention relates to encapsulation structures, encapsulation methods and display devices of organic electroluminescent devices.

BACKGROUND

Organic electroluminescent devices, also called organic electroluminescent diode (OLED) devices, belong to a brand new display technique. OLED is comparable to that of thin film transistor liquid crystal display (TFT-LCD) in terms of display quality, but its price is much lower. OLED has become a hot spot of international research for its significant advantages in panel display such as high luminescence, colorful display, low-voltage DC drive and simple manufacture process. Within less than 20 years, OLED has entered industry stage from research stage.

Generally, OLED devices are formed by depositing a transparent anode layer, a metal cathode layer and more than two organic luminescent layers sandwiched therebetween onto a supporter such as a rigid glass substrate or a flexible polymer substrate. These organic luminescent layers generally comprise hole injection layers, hole transporting layers, luminescent layers, electron transporting layers, electron injection layers and the like. OLED devices are very sensitive to oxygen and vapor. If oxygen and vapor leak into the OLED devices, undesirable phenomena such as black spots, pinholes, electrode oxidation and chemical reactions of the organic materials would occur, which would affect the lifetime of OLED devices. Therefore, encapsulation technology is one of the major technologies that have realized the industrialization of OLED devices.

At present, encapsulation technologies mainly comprise three categories: metal cover encapsulation, glass cover encapsulation and film encapsulation. In the former two categories, sealants have to be disposed around the organic luminescent area, and moisture absorbents have to be placed therein. Multi-layered structures with alternate organic polymer films and inorganic films, which are manufactured on the basis of a vacuum coating process, have been adopted in film encapsulation technology. In this multi-layered structure, the inorganic film functions as a main water and oxygen barrier layer for its high compactness; and the organic polymer film functions as a buffer layer because it can effectively inhibit cracking of the inorganic films for its high elasticity.

SUMMARY

At least one embodiment of the present invention provides encapsulation structures, encapsulation methods and display devices of organic electroluminescent devices, which can effectively improve the water and oxygen barrier ability of the film encapsulation layer, thereby extending the lifetime of OLED devices.

At least one embodiment of the present invention provides encapsulation structures of organic electroluminescent devices, comprising: a substrate; an electroluminescent device located on the substrate; and at least one film encapsulation layer covering the organic electroluminescent device, which comprises an inorganic film and a fluorocarbon polymer film.

At least one embodiment of the present invention further provides a display device comprising the encapsulation structure of the organic electroluminescent device as described above.

At least one embodiment of the present invention further provides an encapsulation method of an organic electroluminescent device, comprising: providing a substrate; manufacturing an organic electroluminescent device on the substrate; and forming at least one film encapsulation layer on the organic electroluminescent device, wherein the film encapsulation layer comprises an inorganic film and a fluorocarbon polymer film.

BRIEF DESCRIPTION OF THE DRAWINGS

In order to illustrate the technical solutions of the embodiments of the present invention more clearly, the drawings of the embodiments will be briefly described below. Apparently, the drawings described below merely involve some embodiments of the present invention, and should not be understood as limitations on the present invention.

REFERENCE SIGNS

1 film encapsulation layer; 2 OLED device; 3 substrate; 11 inorganic film; 12 organic polymer film; and 13 fluorocarbon polymer film.

DETAILED DESCRIPTION

In order to make the object, the technical solutions and the advantages of the embodiments of the invention clearer, the technical solutions of the embodiments of the invention will be described below in a clear and complete way in connection with the drawings related to the embodiments of the invention. Apparently, the embodiments described are just part of but not all of the embodiments of the invention. Based on the embodiments described herein, all the other embodiments obtained by those skilled in the art without any inventive work are within the protection scope of the invention.

The inventors of the present application have noticed that: both categories of metal cover encapsulation and glass cover encapsulation have good water and oxygen barrier capability. However, the metal cover is not transparent and thus not suitable for many occasions; and since the glass cover has a low mechanical strength, the size of the display device is thick, which cannot meet the requirement for flexibility and thinness of OLED devices. In the film encapsulation technology of multi-layered structures comprising alternate organic polymer films and inorganic films, as the inorganic film has low elasticity and great internal stress, it may easily produce cracks or be peeled off from the OLED device under external forces. Common organic polymer films have poor water and oxygen barrier capability, and even some organic polymers possess strong hydroscopicity, as a result of which, water vapor is likely to pass through the defects of the inorganic film adjacent to the organic polymer film to enter the OLED device, thereby shortening the lifetime of OLED devices.

At least one embodiment of the present invention provides encapsulation structures, encapsulation methods and display devices of organic electroluminescent devices, which can effectively improve the water and oxygen barrier capability of the film encapsulation layer, thus extending the lifetime of OLED devices.

Figure 1:
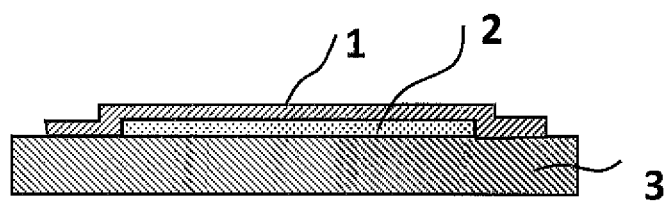
FIG. 1 is a schematic diagram of an encapsulation structure of an organic electroluminescent device provided by at least one embodiment of the present invention.
Figure 2:
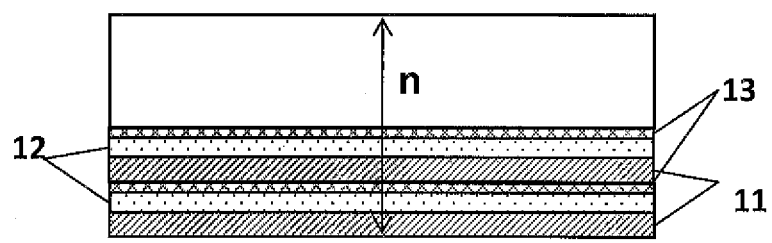
FIG. 2 is a schematic diagram of a film encapsulation layer comprising an inorganic film, an organic polymer film and a fluorocarbon polymer film.

FIG. 1 is a schematic diagram of the encapsulation structure of an OLED device provided by an embodiment of the present invention. As shown in FIG. 1, the encapsulation structure comprises: a substrate 3 for bearing OLED device 2; an OLED device 2 located on the substrate 3; and at least one film encapsulation layer 1 covering the OLED device 2. As shown in FIG. 2, the film encapsulation layer 1 comprises an inorganic film 11 and a fluorocarbon polymer film 13. In at least one embodiment of the present invention, the encapsulation structure further comprises an organic polymer film 12 disposed between the inorganic film 11 and the fluorocarbon polymer film 13.

In the encapsulation structure of the OLED device provided by at least one embodiment of the present invention, a compact fluorocarbon polymer film is incorporated into the film encapsulation layer. Because the fluorocarbon polymer possesses extremely low surface energy and relatively strong hydrophobicity, it can effectively improve the film encapsulation layer's ability to block water and oxygen. In addition, in the encapsulation structure of the OLED device provided by at least one embodiment of the present invention, since the fluorocarbon polymer film may easily form a smooth morphology, the inorganic film prepared thereon may also easily acquire a smooth morphology with few pinholes. By applying the film encapsulation layer to the encapsulation of OLED devices, the lifetime of the OLED devices can be effectively extended, and the reliability of OLED devices during storage and utilization can be advantageously improved.

In different embodiments, OLED devices may be covered with one or more film encapsulation layers according to the requirements. For example, taking water and oxygen blocking capability as well as thinning into account, OLED devices may be covered with 1~20 film encapsulation layers. When an OLED device is covered with a plurality of film encapsulation layers, as shown in FIG. 2, n film encapsulation layers are on the OLED device in an overlapping fashion.

In different embodiments, the fluorocarbon polymer film is a polymer film formed by, for example, plasma polymerization of fluorocarbon gas, and the fluorocarbon gas comprises one or combinations of $CHF_3$, $C_3F_8$, $C_4F_{10}$, $C_2F_4$ and $C_4F_8$. It should be noted that, without limitation, the fluorocarbon polymer film may also be formed from other fluorocarbon compounds in addition to the above fluorocarbon gases.

In different embodiments, the thickness of the inorganic film is from about 5 nm to about 200 nm, the thickness of the fluorocarbon polymer film is from about 5 nm to about 200 nm, and the thickness of the organic polymer film is from about 5 nm to about 200 nm. In different embodiments, the material of the inorganic film is selected from one or combinations of $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC and ITO. In different embodiments, the material of the organic polymer is selected from one or combinations of PET (polyethylene terephthalate), PEN (polyethylene naphthalate), PC (polycarbonate), PI (polyimide), PVC (Polyvinyl chloride), PS (polystyrene), PMMA (polymethylmethacrylate), PBT (polybutylene terephthalate), PSO (polysulfone), PES (poly (p-phenylenediethyl)sulfone), PE (polyethylene), PP (polypropylene), silicone (polysiloxane), PA (polyamide), PVDF (poly(vinylidene fluoride)), EVA (ethylene-vinyl acetate copolymer), EVAL (Ethylene-vinyl alcohol copolymer), PAN (polyacrylonitrile), PVAc (poly(vinyl acetate)), Parylene (poly(p-xylene)), Polyurea, PTFE (polytetrafluoroethylene) and epoxy resin.

At least one embodiment of the present invention provides a display device comprising the above encapsulation structure of OLED devices. The encapsulation structure of OLED devices is the same as that of the above embodiments and will not be further described. Besides, the structure of other parts in the display device will not be described in detail herein, either. The display device may be any product or component having display function such as electronic paper, television, monitor, digital photo frame, mobile phone or panel computer.

At least one embodiment of the present invention provides an encapsulation method of an organic electroluminescent device, which comprises: providing a substrate; manufacturing an organic electroluminescent device on the substrate; and forming at least one film encapsulation layer on the organic electroluminescent device, wherein the film encapsulation layer comprises an inorganic film and a fluorocarbon polymer film. In the encapsulation method provided by at least one embodiment of the present invention, the film encapsulation layer may further comprise an organic polymer film disposed between the inorganic film and the fluorocarbon polymer film.

In the encapsulation method of OLED devices provided by at least one embodiment of the present invention, a compact fluorocarbon polymer film is incorporated into the film encapsulation layer. Because the fluorocarbon polymer possesses extremely low surface energy and relatively strong hydrophobicity, it can effectively improve the film encapsulation layer's ability to block water and oxygen. In addition, in the encapsulation method of the OLED device provided by at least one embodiment of the present invention, since the fluorocarbon polymer film may easily form a smooth morphology, the inorganic film prepared thereon may also easily acquire a smooth morphology with few pinholes. By applying the film encapsulation layer to the encapsulation of OLED devices, the lifetime of the OLED devices can be effectively extended, and the reliability of OLED devices during storage and utilization can be advantageously improved.

In one embodiment, forming a film encapsulation layer on the OLED device comprises: depositing, for example, a layer of inorganic materials on the OLED device to form the inorganic film; and forming the fluorocarbon polymer film through for example plasma polymerization of fluorocarbon gas.

In one embodiment, forming a film encapsulation layer on the OLED device further comprises: depositing, for example, a layer of organic polymers on the inorganic film to form the organic polymer film.

In one embodiment, depositing, for example, a layer of inorganic materials on the OLED device to form the inorganic film comprises: depositing, for example, a layer of inorganic materials on the OLED device to form the inorganic film through ion beam sputtering deposition, magnetic sputtering deposition or atomic layer deposition.

The depositing, for example, a layer of organic polymers on the inorganic film to form the organic polymer film comprises: depositing, for example, a layer of organic polymers on the inorganic film to form the organic polymer film through a solution film-forming method or chemical vapor deposition. For example, the organic polymer film is formed on the inorganic film utilizing chemical vapor deposition.

In one embodiment, the forming the fluorocarbon polymer film on the organic polymer film through for example plasma polymerization of fluorocarbon gas comprises: producing a fluorocarbon gas plasma through radio-frequency discharge of fluorocarbon gas. In different embodiments, the frequency of the radio-frequency source is about 13.56 MHz, the power of the radio-frequency source is from about 50 W to about 200 W, the ambient pressure is from about 300 mTorr to about 400 mTorr, and the flow velocity of the fluorocarbon gas is from about 20 sccm to about 80 sccm. In different embodiments, the fluorocarbon gas comprises one or combinations of $CHF_3$, $C_3F_8$, $C_4F_{10}$, $C_2F_4$ and $C_4F_8$. It should be noted that, the frequency of the radio-frequency source and the like in the embodiments of the present invention are only the exemplary conditions suitable for producing fluorocarbon gas plasma through radio-frequency discharge. The embodiments of the present invention are not limited by them. In addition, without limitation, the fluorocarbon polymer film may also be formed by other fluorocarbon compounds than the above fluorocarbon gases.

In the following embodiments, the encapsulation structure and encapsulation method of OLED devices will be described below in detail.

If the film encapsulation layer is formed by alternatively stacking organic polymer films and inorganic films, since organic polymer films have poor capability to block water and oxygen, and even some organic polymers possess strong hydroscopicity, water vapor is likely pass through the defects of adjacent inorganic films to enter the OLED device, thereby shortening the lifetime of OLED devices. There are two ways to change the hydroscopicity of the organic polymer material's surface, where one way is to reduce the surface energy by changing the chemical properties of the organic polymer material's surface and the other way is to increase the roughness of the organic polymer material's surface. With regard to the first way, for its small atomic diameter and large electronegativity, fluorine atom can form stable chemical bonds with other atoms (such as carbon atoms), and thus can effectively reduce surface energy of materials. Therefore, materials (for example, inorganic materials, organic polymers) can attain hydrophobicity through plasma polymerization or plasma modification of fluorocarbon compounds. For example, a layer of CFx can be formed on the surface of ITO by polymerization of $CHF_3$ gas via a plasma-surface modification process, thus making the ITO hydrophobic and improving the smoothness of the surface of the ITO. For another example, chemical bonds are changed after the reaction between the plasma obtained from $CF_4$ gas and the silicone rubber surface, and fluorocarbon function groups and fluorosilicon function groups are formed on the silicone rubber surface, which can improve the hydrophobicity of the silicone rubber.

Based on this characteristic of fluorocarbon compounds, at least one embodiment of the present invention provides a method of incorporating a compact fluorocarbon polymer film into the film encapsulation layer. Because the fluorocarbon polymer possesses extremely low surface energy and relatively strong hydrophobicity, the ability for the film encapsulation layer to block water and oxygen can be effectively improved by applying this encapsulation method to the encapsulation of OLED devices.

Example 1 $Al_2O_3$(50 nm)/poly(chloro-p-xylylene)(50 nm)/CFx(10 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of $Al_2O_3$ on the substrate from step b through ion beam sputtering deposition. The vacuum degree of the deposition chamber is $10^{-6}$ Pa, the deposition time is 10 min, and the thickness of the $Al_2O_3$ film is 50 nm;

Step d: depositing a layer of poly(chloro-p-xylylene) on the film of $Al_2O_3$ through chemical vapor deposition. For example, first, the solid C type poly(chloro-p-xylylene) is sublimed at 100° C. such that two side chain carbon-carbon bonds of the C type poly(chloro-p-xylylene) are broken at 630° C. to generate stable active monomers; second, the active monomers are introduced into the deposition chamber through a catheter and deposited on the $Al_2O_3$ film, where the vacuum degree in the deposition chamber is $10^{-6}$ Pa, the deposition time is 5 min, and the thickness of the deposited C type poly(chloro-p-xylylene) is 50 nm;

Step e: depositing a CFx polymer film with a thickness of 10 nm on the poly(chloro-p-xylylene) layer by plasma polymerization of $CHF_3$ gas. For example, $CHF_3$ gas plasma may be produced through radio-frequency discharge of $CHF_3$ gas. In one embodiment, the frequency of the radio-frequency source is 13.56 MHz, the power of the radio-frequency source is from 50 W to 200 W, for example 50 W, the ambient pressure is from 300 mTorr to 400 mTorr, for example 350 mTorr, and the flow velocity of the $CHF_3$ gas is from 20 sccm to 80 sccm, for example 80 sccm.

By repeating steps c-e, a plurality of film encapsulation layers can be formed on the OLED device to obtain an encapsulation structure of the OLED device. If M film encapsulation layers are required to be formed on the OLED device, the above steps shall be repeated for M times. For example, in the present embodiment, the film encapsulation layer with three fluorocarbon polymer films can be obtained by repeating the above steps c-e for three times.

Example 2 SiO(100 nm)/poly(chloro-p-xylylene)(200 nm)/CFx(20 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of SiO on the substrate from step b through magnetic sputtering deposition. The vacuum degree of the deposition chamber is $10^{-5}$ Pa, the deposition time is 10 min, and the thickness of the SiO film is 100 nm;

Step d: depositing a layer of poly(chloro-p-xylylene) on the SiO film through chemical vapor deposition. For example, first, the solid C type poly(chloro-p-xylylene) is sublimed at 100° C. such that two side chain carbon-carbon bonds of the C type poly(chloro-p-xylylene) are broken at 630° C. to generate stable active monomers; second, the active monomers are introduced into the deposition chamber through a catheter and deposited on the SiO film, where the vacuum degree in the deposition chamber is $10^{-6}$ Pa, the deposition time is 20 min, and the thickness of the deposited C type poly(chloro-p-xylylene) is 200 nm;

Step e: depositing a CFx polymer film with a thickness of 20 nm on the poly(chloro-p-xylylene) layer by plasma polymerization of $CHF_3$ gas to form an encapsulation structure of OLED device. For example, $CHF_3$ gas plasma may be produced through radio-frequency discharge of $CHF_3$ gas. In one embodiment, the frequency of the radio-frequency source is 13.56 MHz, the power of the radio-frequency source is from 50 W to 200 W, for example 200 W, the ambient pressure is from 300 mTorr to 400 mTorr, for example 350 mTorr, and the flow velocity of the $CHF_3$ gas is from 20 sccm to 80 sccm, for example 20 sccm.

Example 3 SiON(100 nm)/poly(chloro-p-xylylene)(200 nm)/CFx(20 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of SiON on the substrate from step b through magnetic sputtering deposition. The vacuum degree of the deposition chamber is $10^{-5}$ Pa, the deposition time is 10 min, and the thickness of the SiON film is 100 nm;

Step d: depositing a layer of poly(chloro-p-xylylene) on the SiON film through chemical vapor deposition. For example, first, the solid C type poly(chloro-p-xylylene) is sublimed at 100° C. such that two side chain carbon-carbon bonds of the C type poly(chloro-p-xylylene) are broken at 630° C. to generate stable active monomers; second, the active monomers are introduced into the deposition chamber through a catheter and deposited on the SiON film, where the vacuum degree in the deposition chamber is $10^{-6}$ Pa, the deposition time is 20 min, and the thickness of the deposited C type poly(chloro-p-xylylene) is 200 nm;

Step e: depositing a CFx polymer film with a thickness of 20 nm on the poly(chloro-p-xylylene) layer by plasma polymerization of $CHF_3$ gas to form an encapsulation structure of the OLED device. For example, $CHF_3$ gas plasma may be produced through radio-frequency discharge of $CHF_3$ gas. In one embodiment, the frequency of the radio-frequency source is 13.56 MHz, the power of the radio-frequency source is from 50 W to 200 W, for example 100 W, the ambient pressure is from 300 mTorr to 400 mTorr, for example 400 mTorr, and the flow velocity of the $CHF_3$ gas is from 20 sccm to 80 sccm, for example 50 sccm.

Example 4 SiN(30 nm)/poly(chloro-p-xylylene)(50 nm)/CFx(10 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of SiN on the substrate from step b through magnetic sputtering deposition; the vacuum degree of the deposition chamber is $10^{-6}$ Pa, the deposition time is 10 min, and the thickness of the SiN film is 30 nm;

Step d: depositing a layer of poly(chloro-p-xylylene) on the SiN film through chemical vapor deposition. For example, first, the solid C type poly(chloro-p-xylylene) is sublimed at 100° C. such that two side chain carbon-carbon bonds of the C type poly(chloro-p-xylylene) are broken at 630° C. to generate stable active monomers; second, the active monomers are introduced into the deposition chamber through a catheter and deposited on the SiN film, where the vacuum degree in the deposition chamber is $10^{-6}$ Pa, the deposition time is 5 min, and the thickness of the deposited C type poly(chloro-p-xylylene) is 50 nm;

Step e: depositing a CFx polymer film with a thickness of 10 nm on the poly(chloro-p-xylylene) layer by plasma polymerization of $CHF_3$ gas. For example, $CHF_3$ gas plasma may be produced through radio-frequency discharge of $CHF_3$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the $CHF_3$ gas is from 20 sccm to 80 sccm, for example 40 sccm.

By repeating steps c-e, a plurality of film encapsulation layers can be formed on the OLED device to obtain an encapsulation structure of the OLED device. If M film encapsulation layers are required to be formed on the OLED device, then the above steps shall be repeated for M times. For example, in the present embodiment, the film encapsulation layer with three fluorocarbon polymer films can be obtained by repeating the above steps c-e for three times.

Example 5 SiN(30 nm)/epoxy resin (200 nm)/CFx(20 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of SiN on the substrate from step b through magnetic sputtering deposition. The vacuum degree of the deposition chamber is $10^{-5}$ Pa, the deposition time is 10 min, and the thickness of the SiN film is 30 nm;

Step d: pouring a mixture of an acrylic epoxy resin and a photo initiator onto the SiN film to cast a film (a solution film-forming method), irradiating the film with ultra-violet light to initiate polymerization, and finally forming an epoxy resin film with a thickness of 200 nm;

Step e: depositing a CFx polymer film with a thickness of 20 nm on the epoxy resin film by plasma polymerization of $C_2F_4$ gas to form an encapsulation structure of the OLED device. For example, $C_2F_4$ gas plasma may be produced through radio-frequency discharge of $C_2F_4$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the $C_2F_4$ gas is from 20 sccm to 80 sccm, for example 50 sccm.

Example 6 Al$_2$O$_3$(5 nm)/poly(chloro-p-xylylene)(50 nm)/CFx(10 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of Al$_2$O$_3$ on the substrate from step b through ion beam sputtering deposition. The vacuum degree of the deposition chamber is $10^{-6}$ Pa, the deposition time is 1 min, and the thickness of the Al$_2$O$_3$ film is 5 nm;

Step d: depositing a layer of poly(chloro-p-xylylene) on the Al$_2$O$_3$ film through chemical vapor deposition. For example, first, the solid C type poly(chloro-p-xylylene) is sublimed at 100° C. such that two side carbon-carbon bonds are broken at 630° C. to generate stable active monomers; second, the active monomers are introduced into the deposition chamber through a catheter and deposited on the Al$_2$O$_3$ film, where the vacuum degree in the deposition chamber is $10^{-6}$ Pa, the deposition time is 5 min, and the thickness of the deposited C type poly(chloro-p-xylylene) is 50 nm;

Step e: depositing a CFx polymer film with a thickness of 10 nm on the poly(chloro-p-xylylene) layer by plasma polymerization of CHF$_3$ gas. For example, CHF$_3$ gas plasma may be produced through radio-frequency discharge of CHF$_3$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the CHF$_3$ gas is from 20 sccm to 80 sccm, for example 50 sccm.

By repeating the above steps c-e, a plurality of film encapsulation layers can be formed on the OLED device to obtain an encapsulation structure of the OLED device. If M film encapsulation layers are required to be formed on the OLED device, then the above steps shall be repeated for M times. For example, in the present embodiment, the film encapsulation layer with 20 fluorocarbon polymer films can be obtained by repeating the above steps c-e for 20 times.

Example 7 Al$_2$O$_3$(200 nm)/poly(chloro-p-xylylene)(100 nm)/CFx(5 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a film of Al$_2$O$_3$ on the substrate from step b through ion beam sputtering deposition. The vacuum degree of the deposition chamber is $10^{-6}$ Pa, the deposition time is 40 min, and the thickness of the Al$_2$O$_3$ film is 200 nm;

Step d: depositing a layer of poly(chloro-p-xylylene) on the Al$_2$O$_3$ film through chemical vapor deposition. For example, first, the solid C type poly(chloro-p-xylylene) is sublimed at 100° C. such that two side carbon-carbon bonds are broken at 630° C. to generate stable active monomers; second, the active monomers are introduced into the deposition chamber through a catheter and deposited on the Al$_2$O$_3$ film, where the vacuum degree in the deposition chamber is $10^{-6}$ Pa, the deposition time is 10 min, and the thickness of the deposited C type poly(chloro-p-xylylene) is 100 nm;

Step e: depositing a CFx polymer film with a thickness of 5 nm on the poly(chloro-p-xylylene) layer by plasma polymerization of CHF$_3$ gas. For example, CHF$_3$ gas plasma may be produced through radio-frequency discharge of CHF$_3$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the CHF$_3$ gas is from 20 sccm to 80 sccm, for example 50 sccm.

By repeating the above steps c-e, a plurality of film encapsulation layers can be formed on the OLED device to obtain an encapsulation structure of the OLED device. If M film encapsulation layers are required to be formed on the OLED device, the above steps shall be repeated for M times. For example, in the present embodiment, the film encapsulation layer with one fluorocarbon polymer film can be obtained by performing the above steps c-e for only one time.

Example 8 Al$_2$O$_3$(50 nm)/poly(chloro-p-xylylene)(5 nm)/CFx(200 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a layer of Al$_2$O$_3$ film on the substrate from step b through ion beam sputtering deposition. The vacuum degree of the deposition chamber is $10^{-6}$ Pa, the deposition time is 10 min, and the thickness of the Al$_2$O$_3$ film is 50 nm;

Step d: depositing a layer of poly(chloro-p-xylylene) on the Al$_2$O$_3$ film through chemical vapor deposition. For example, first, the solid C type poly(chloro-p-xylylene) is sublimed at 100° C. such that two side carbon-carbon bonds are broken at 630° C. to generate stable active monomers; second, the active monomers are introduced into the deposition chamber through a catheter and deposited on the Al$_2$O$_3$ film, where the vacuum degree in the deposition chamber is $10^{-6}$ Pa, the deposition time is 0.5 min, and the thickness of the deposited C type poly(chloro-p-xylylene) is 5 nm;

Step e: depositing a CFx polymer film with a thickness of 200 nm on the poly(chloro-p-xylylene) layer by plasma polymerization of CHF$_3$ gas. For example, CHF$_3$ gas plasma may be produced through radio-frequency discharge of CHF$_3$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the CHF$_3$ gas is from 20 sccm to 80 sccm, for example 50 sccm.

By repeating the above steps c-e, a plurality of film encapsulation layers can be formed on the OLED device to obtain an encapsulation structure of the OLED device. If M film encapsulation layers are required to be formed on the OLED device, then the above steps shall be repeated for M times. For example, in the present embodiment, the film encapsulation layer with three fluorocarbon polymer films can be obtained by repeating the above steps c-e for three times.

Example 9 Al$_2$O$_3$(50 nm)/poly(chloro-p-xylylene)(5 nm)/CFx(200 nm)

The encapsulation method of OLED device of the present example includes the following steps:

Step a: providing a substrate, which may be a quartz substrate, a glass substrate or a polymer substrate and the like;

Step b: producing an OLED device on the substrate;

Step c: depositing a layer of Al$_2$O$_3$ film on the substrate from step b by atomic layer deposition; the thickness of the Al$_2$O$_3$ film is 50 nm; according to the atomic layer deposition method, the Al$_2$O$_3$ film should be formed at a temperature of less than 100° C. to avoid damage of the OLED device;

Step d: depositing a layer of poly(chloro-p-xylylene) on the Al$_2$O$_3$ film by chemical vapor deposition. For example, first, the solid C type poly(chloro-p-xylylene) is sublimed at 100° C. such that two side carbon-carbon bonds are broken at 630° C. to generate stable active monomers; second, the active monomers are introduced into the deposition chamber through a catheter and deposited on the Al$_2$O$_3$ film, where the vacuum degree in the deposition chamber is 10$^{-6}$ Pa, the deposition time is 0.5 min, and the thickness of the deposited C type poly(chloro-p-xylylene) is 5 nm;

Step e: depositing a CFx polymer film with a thickness of 200 nm on the poly(chloro-p-xylylene) layer by plasma polymerization of CHF$_3$ gas. For example, CHF$_3$ gas plasma may be produced through radio-frequency discharge of CHF$_3$ gas. In one embodiment, the frequency of the radio-frequency source is 13.56 MHz, the power of the radio-frequency source is from 50 W to 200 W, for example 150 W, the ambient pressure is from 300 mTorr to 400 mTorr, for example 300 mTorr, and the flow velocity of the CHF$_3$ gas is from 20 sccm to 80 sccm, for example 50 sccm.

By repeating the above steps c-e, a plurality of film encapsulation layers can be formed on the OLED device to obtain an encapsulation structure of the OLED device. If M film encapsulation layers are required to be formed on the OLED device, the above steps shall be repeated for M times. For example, in the present embodiment, the film encapsulation layer with three fluorocarbon polymer films can be obtained by repeating the above steps c-e for three times.

It should be noted that, the above embodiments are explanations employing a film encapsulation layer comprising an inorganic film, an organic polymer film and a fluorocarbon polymer film as an example. When the film encapsulation layer comprises an inorganic film and a fluorocarbon polymer film, the film encapsulation layer, for example, may comprise an ITO film and a fluorocarbon polymer film formed by plasma polymerization of CHF$_3$ gas, which can be seen in the above related description. Of course, the embodiments of the present invention are not limited by them. In addition to plasma polymerization of CHF$_3$ gas, the fluorocarbon polymer film in the above embodiments may also be formed by other methods such as fluorocarbon compound plasma modification (for example, as explained in the above example of improving the hydrophobicity of the silicone rubber with the plasma generated from CF$_4$ gas). The fluorocarbon compound may be a fluorocarbon gas, and may also be other fluorocarbon materials, which will not be described in detail herein.

In the encapsulation structures of OLED devices provided by the above embodiments of the present invention, one or more compact fluorocarbon polymer films are incorporated into the film encapsulation layer. Because the fluorocarbon polymer possesses extremely low surface energy and relatively strong hydrophobicity, it can effectively improve the film encapsulation layer's ability to block water and oxygen. By applying the film encapsulation layer to the encapsulation of OLED devices, the lifetime of the OLED devices can be effectively extended, and the reliability of the OLED devices during storage and utilization can be advantageously improved.

The above embodiments are the preferred embodiments of the present invention. It should be pointed out that those skilled in the art can modify or change the present invention without deviating from the principle of the invention. Therefore, these modifications or changes are intended within the present invention.

The present application claims the benefits of the Chinese Application No. 201310454581.1 filed on Sep. 29, 2013, the entire disclosure of which is incorporated herein by reference.

The invention claimed is:

1. An encapsulation structure of an organic electroluminescent device, comprising:
   a substrate;
   an organic electroluminescent device located on the substrate; and
   at least one film encapsulation layer covering the organic electroluminescent device, wherein the film encapsulation layer consists of an inorganic film, a fluorocarbon polymer film, and an organic polymer film disposed between the inorganic film and the fluorocarbon polymer film,
   wherein the organic electroluminescent device is covered with from 1 to 20 layers of the film encapsulation layer, and
   wherein the encapsulation structure excludes a pressure sensitive adhesive layer except for the 1 to 20 layers of the film encapsulation layer,
   wherein the material of the organic polymer film is selected from one or combinations of PET (polyethylene terephthalate), PEN (polyethylene naphthalate), PC (polycarbonate), PI (polyimide), PVC (Polyvinyl chloride), PS (polystyrene), PMMA (polymethylmethacrylate), PBT (polybutylene terephthalate), PSO (polysulfone), PES (poly(p-phenylenediethyl)sulfone), PE (polyethylene), PP (polypropylene), silicone (polysiloxane), PA (polyamide), PVDF (poly(vinylidene fluoride)), EVA (ethylene-vinyl acetate copolymer), EVAL (Ethylene-vinyl alcohol copolymer), PAN (polyacrylonitrile), PVAc (poly(vinyl acetate)), Parylene (poly(p-xylene)), Polyurea, PTFE (polytetrafluoroethylene) and epoxy resin.

2. The encapsulation structure of an organic electroluminescent device according to claim 1, wherein the fluorocarbon polymer film is a polymer film formed by treating a plasma of fluorocarbon gas comprising one or a combination of CHF$_3$, C$_3$F$_8$, C$_4$F$_{10}$, C$_2$F$_4$ and C$_4$F$_8$.

3. The encapsulation structure of an organic electroluminescent device according to claim 1, wherein the thickness of the inorganic film is from about 5 nm to about 200 nm, and the thickness of the fluorocarbon polymer film is from about 5 nm to about 200 nm.

4. The encapsulation structure of an organic electroluminescent device according to claim 1, wherein the material of the inorganic film is selected from one or combinations of $Al_2O_3$, $TiO_2$, $ZrO_2$, MgO, $HfO_2$, $Ta_2O_5$, $Si_3N_4$, AlN, SiN, SiNO, SiO, $SiO_2$, $SiO_x$, SiC and ITO.

5. A display device comprising the encapsulation structure of an organic electroluminescent device according to claim 1.

6. An encapsulation method of an organic electroluminescent device, comprising:
providing a substrate;
manufacturing an organic electroluminescent device on the substrate; and
forming at least one film encapsulation layer on the organic electroluminescent device, wherein the film encapsulation layer consists of an inorganic film, a fluorocarbon polymer film, and an organic polymer film disposed between the inorganic film and the fluorocarbon polymer film,
wherein the organic electroluminescent device is covered with from 1 to 20 layers of the film encapsulation layer, and
wherein the encapsulation structure excludes a pressure sensitive adhesive layer except for the 1 to 20 layers of the film encapsulation layer,
wherein the material of the organic polymer film is selected from one or combinations of PET (polyethylene terephthalate), PEN (polyethylene naphthalate), PC (polycarbonate), PI (polyimide), PVC (Polyvinyl chloride), PS (polystyrene), PMMA (polymethylmethacrylate), PBT (polybutylene terephthalate), PSO (polysulfone), PES (poly(p-phenylenediethyl)sulfone), PE (polyethylene), PP (polypropylene), silicone (polysiloxane), PA (polyamide), PVDF (poly(vinylidene fluoride)), EVA (ethylene-vinyl acetate copolymer), EVAL (Ethylene-vinyl alcohol copolymer), PAN (polyacrylonitrile), PVAc (poly(vinyl acetate)), Parylene (poly(p-xylene)), Polyurea, PTFE (polytetrafluoroethylene) and epoxy resin.

7. The encapsulation method of an organic electroluminescent device according to claim 6, wherein the forming at least one film encapsulation layer on the organic electroluminescent device comprises:

forming the inorganic film by depositing inorganic materials on the organic electroluminescent device;
forming the organic polymer film by depositing an organic polymer on the inorganic film; and
forming the fluorocarbon polymer film by treatment of a fluorocarbon gas plasma.

8. The encapsulation method of an organic electroluminescent device according to claim 7, wherein the treatment of a fluorocarbon gas plasma comprises fluorocarbon gas plasma polymerization or fluorocarbon gas plasma modification.

9. The encapsulation method of an organic electroluminescent device according to claim 7, wherein the forming the fluorocarbon polymer film by treatment of a fluorocarbon gas plasma comprises:
producing a plasma of fluorocarbon gas through radio-frequency discharge of the fluorocarbon gas, wherein the frequency of the radio-frequency source is about 13.56 MHz, the power of the radio-frequency source is from about 50 W to about 200 W, the ambient pressure is from about 300 mTorr to about 400 mTorr, and the flow velocity of the fluorocarbon gas is from about 20 sccm to about 80 sccm.

10. The encapsulation method of an organic electroluminescent device according to claim 7, wherein the forming the inorganic film by depositing an inorganic material on the organic electroluminescent device comprises:
forming the inorganic film by depositing an inorganic material on the organic electroluminescent device through ion beam sputtering deposition, magnetic sputtering deposition or atomic layer deposition.

11. The encapsulation method of an organic electroluminescent device according to claim 7, wherein the forming the organic polymer film by depositing an organic polymer on the inorganic film comprises:
forming the organic polymer film by depositing an organic polymer on the inorganic film through a solution film-forming method or a chemical vapor deposition.

* * * * *